United States Patent [19]

Takahashi et al.

[11] Patent Number: 4,488,806
[45] Date of Patent: Dec. 18, 1984

[54] SHOT ARRANGING METHOD IN A DIVISIONAL PRINTING APPARATUS

[75] Inventors: Kazuo Takahashi; Hiroshi Sato, both of Tokyo; Masao Kosugi, Yokohama, all of Japan

[73] Assignee: Canon Kabushiki Kaisha, Tokyo, Japan

[21] Appl. No.: 449,825

[22] Filed: Dec. 14, 1982

[30] Foreign Application Priority Data

Dec. 21, 1981 [JP] Japan ................. 56-207679

[51] Int. Cl.³ .............. G03B 27/32; G03B 27/44
[52] U.S. Cl. ........................... 355/77; 355/54
[58] Field of Search ............ 355/53, 54, 40, 86, 355/95, 77; 428/901; 430/312

[56] References Cited

U.S. PATENT DOCUMENTS 4,431,304 2/1984 Mayer .................. 355/54

Primary Examiner—Richard A. Wintercorn
Attorney, Agent, or Firm—Fitzpatrick, Cella, Harper & Scinto

[57] ABSTRACT

In a divisional printing apparatus wherein the pattern of a mask is reduced and projected for printing onto a wafer and the mask and the wafer are moved relative to each other at each shot so that the exposed areas thereof do not overlap each other, and whereby the same pattern as that for collective printing is printed onto the effective area of the wafer by a plurality of shots, a shot arranging method in which, in the case of a so-called multichip shot in which a plurality of chips are exposed at a time at each shot, the special chip area of the wafer is not exposed, but the wafer is effectively exposed so that the creation of unusable chips is minimized.

3 Claims, 6 Drawing Figures

SHOT ARRANGING METHOD IN A DIVISIONAL PRINTING APPARATUS

BACKGROUND OF THE INVENTION

1. Field of the Invention

This invention relates to a shot arranging method that avoids the need for special chips used in semiconductor printing apparatus, and particularly relates to a divisional printing apparatus (stepper) using reduction projection exposure.

2. Description of the Prior Art

Generally, semiconductor printing apparatus are such that a pattern provided on a mask which is a negative is printed onto a wafer, and as the method of printing such pattern onto the wafer, there is a type in which the printing is effected in a single shot (collective printing) and a type in which the printing is effected in a plurality of shots (divisional printing). The collective printing is used in cases where the printing is effected with the mask and the wafer brought into contact with each other (the contact method); in cases where the printing is effected with the mask and the wafer opposed to each other with a minute gap therebetween and without an intermediary imaging system (the proximity method) and in cases where the printing is effected with the mask and the wafer separated sufficiently from each other and with the mask and the wafer maintained in an imaging relationship by a one-to-one magnification imaging system using a lens system or a mirror system (the one-to-one magnification projection method). That is, in the collective printing method, the pattern of the mask is printed intact onto the wafer at one time. In the collective printing method, however, a difficulty in making the mask has been encountered particularly when an element dense in its degree of integration is to be formed, because the desired pattern to be printed onto the wafer is minute and the pattern provided on the mask also is of the same one-to-one magnification shape as the pattern of the wafer.

With this point taken into account, the pattern of the mask has been reduced and projected onto the wafer by the use of a lens system the imaging magnification of which is smaller than 1 and such pattern has been printed onto the wafer. The mask and the wafer are moved relative to each other at each shot so that the exposed areas thereof do not overlap each other, and the same pattern is printed as that in case of the collective printing onto the effective area of the wafer by a plurality of shots.

If divisional printing by such reduction projection exposure is carried out, the pattern provided on the mask is made larger than the pattern to be printed onto the wafer by an inverse number times of the imaging magnification of the imaging system and thus, the difficulty with which the mask is manufactured is reduced. Where divisional printing is carried out, there is a method in which a stage is moved rectilinearly at each shot as shown in FIG. 1 of the accompanying drawings. In this method, the stage is moved rectilinearly, for example, in the X direction so that the errors in the X direction and the Y direction do not accumulate with respect to the feed accuracy of the stage.

In FIG. 1, letter a designates a wafer, letter b denotes the areas to be exposed at each shot, numbers indicate the order of shots, and arrows indicate the feed direction.

As regards the shots, 4 to 5 and 28 to 29 are shown as oblique movement, but these are concerned with the non-effective areas and, as regards effective areas only, rectilinear movement takes place.

This method, however, has the following disadvantages.

In the case of the so-called multichip shot in which a plurality of chips are exposed at one time at each shot, there are many unusable chips which are not printed onto the wafer. This is a problem which arises particularly when divisional printing is mingled with the collective printing. Such problem occurs because, during divisional printing, an effort is made so that the alignment key pattern for collective printing and special chip areas such as test chips are not exposed.

That is, in FIG. 1, shot arrangement is effected so that special chip areas c are not exposed during the divisional printing. However, since there is no shot which includes a special chip area, no chip is printed onto the portion in this shot area except the special chip area and in case of a "1-shot 4-chip" multichip shot, three unusable chips d are produced.

The above-noted problem also holds true of the so-called die-by-die alignment in which alignment is effected at each shot.

SUMMARY OF THE INVENTION

It is a first object of the present invention to provide a special shot arranging method whereby ineffective chips are minimized and chips are effectively printed onto the surface of a wafer except in a special chip area.

It is a second object of the present invention to provide a shot arranging method in which the internal spacing L between the special chips on a wafer is limited to a predetermined range.

This object is achieved by arranging shots in an oblique direction at least around a special chip, in accordance with the spacing between the special chips and the size of the exposure area of each shot so as to minimize the ineffective chips around the special chips. The object is further achieved by determining the internal spacing L between the special chips to be $L=(mN+q)l$ when m chips are to be printed at one shot in the direction of arrangement of the special chips and the width of one chip is l. N is a positive integer, and q is a positive integer which is $0 \leq q \leq m-2$.

The invention will become more fully apparent from the following detailed description thereof taken in conjunction with the accompanying drawings.

DESCRIPTION OF THE PREFERRED EMBODIMENTS

Figure 2:
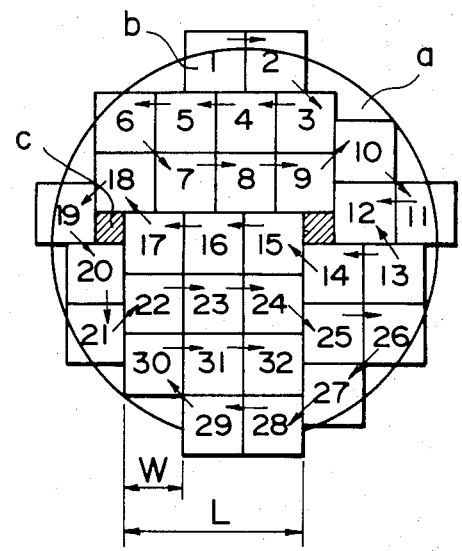
FIG. 2 illustrates an embodiment of the shot arrangement of the present invention in the case of a "1-shot 4-chip" arrangement.

FIG. 2 illustrates an embodiment of the present invention in the case of a "1-shot 4-chip" arrangement. By effecting shot arrangement in the order of the numbers shown there, the effective area of a wafer can be exposed while avoiding only a special chip area. That is, shots are not arranged rectilinearly as in the prior art, but are arranged in an oblique direction around at least a special chip c so that the exposed area b does not create an unwanted blank portion around the special chip c as far as possible. Of course, a blank portion of a size containing the special chip c must be defined.

The general solution will be described later and here, for the sake of simplicity, it is to be understood that the internal spacing L between two special chips c is a multiple of the width W of the area b to be exposed.

In this case, there is no unusable chip because of the shot arrangement as shown in FIG. 2.

Figure 1:
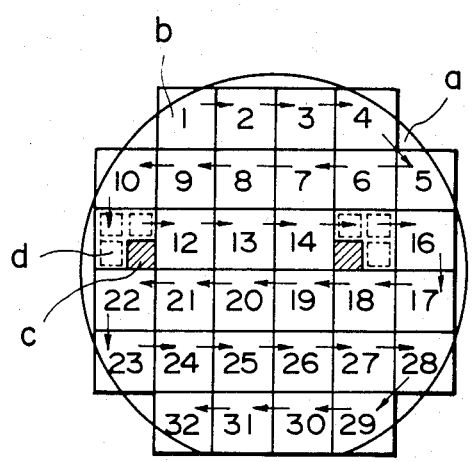
FIG. 1 illustrates the shot arranging method in divisional printing according to the prior art.

In FIG. 2, as in FIG. 1, printing is effected at 32 shots, but in the case of a "1-shot 4-chip" multichip shot, six unusable chips d are created in the arrangement shown in FIG. 1, whereas the number of unusable chips is zero in arrangement of FIG. 2. In the present invention, the shot order is not restricted to the shown one. Also, in the case of the popular multichip shot in which more than four chips are exposed at one shot, it is possible to minimize the creation of unusable chips while avoiding only the special chip area, and this will hereinafter be described by reference to FIG. 3.

FIGS. 3A, 3B, 3C and 3D show that the number of unusable chips can be minimized in accordance with the spacing L between special chips.

Generally, if the number of chips for one shot is $m \times n$ (m in the direction of arrangement of special chips and n in the direction orthogonal thereto) and l is the length of the side in the direction of arrangement of special chips in one chip and N is a positive integer ($N \geq 1$) and q is a integer positive which does not exceed m ($0 \leq q \leq m-1$) and the internal spacing L between special chips is $L = (mN+q)l$, then, when $0 \leq q \leq m-2$, the maximum number of unusable chips is $(m-2)$, and when $q = m-1$, the maximum number of unusable chips is $(m-1)$.

Figure 3A:
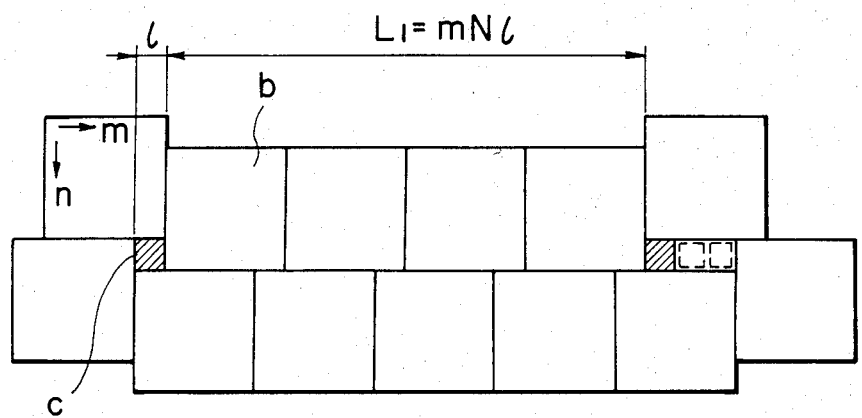
FIGS. 3A, 3B, 3C and 3D illustrate embodiments in which the present invention is applied to the popular multichip shot.
Figure 3B:
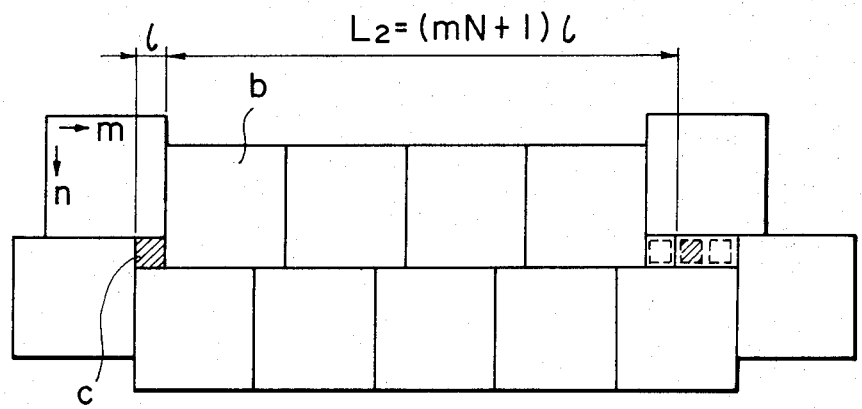
Figure 3C:
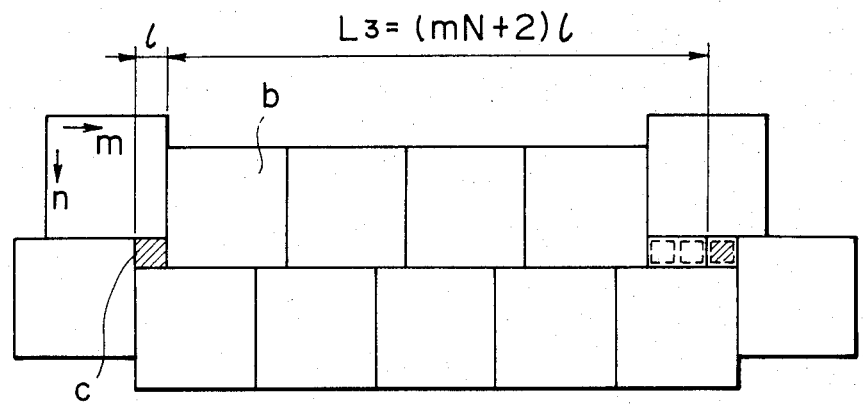

This will be understood from FIGS. 3A, 3B, 3C and 3D. FIG. 3A shows the case where $q=0$, FIG. 3B shows the case where $q=1$, and FIG. 3C shows the case where $q=2$. In these cases, the sum of the maximum numbers of unexposed chips in the left and right portions is m and the number of unusable chips, except the two special chips, is $(m-2)$.

Figure 3D:
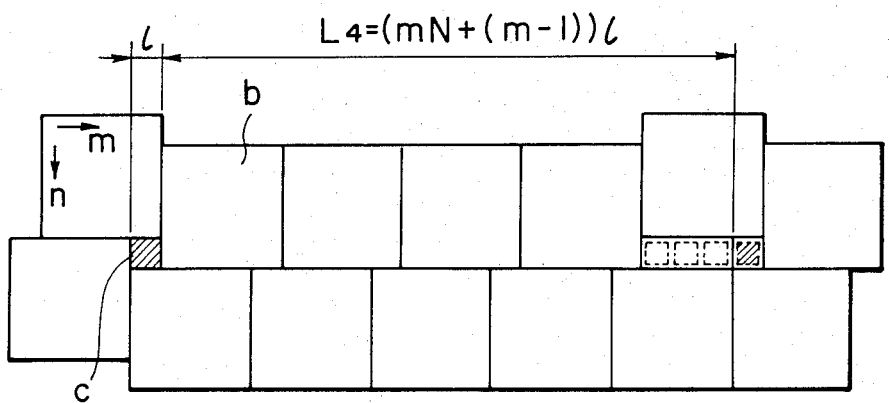

FIG. 3D shows the case where $q=m-1$ (for example, $q=3$ when $m=4$). Around the right-hand special chip as viewed in FIG. 3D, m chips are not exposed. In other words, the sum of the maximum numbers of unexposed chips in the left and right portions is $(m+1)$ and the number of unusable chips, except the special chips, is $(m-1)$.

In the case of the prior art method as shown in FIG. 1, if $m \times n$ chips are exposed at one shot, the sum of the minimum numbers of unexposed chips is 2 mn and the number of unusable chips, except the two special chips, is $(2mn-2)$ and thus, the usefulness of the minimum number $(m-2)$ of unusable chips according to the present invention will be understood.

As described above, according to the present invention, the creation of unusable chips can be minimized in accordance with the spacing between special chips and the size of the area to be exposed at each shot. Further, by determining the spacing L between special chips to $L = (mN+q)l$, where $0 \leq q \leq m-2$, the absolute number of unusable chips can be minimized to $(m-2)$, and this is very useful in the divisional printing.

What is claimed is:

1. A divisional printing method for divisionally printing a pattern from a mask onto a wafer by a plurality of exposure shots each at one of a plurality of exposure sites on the wafer except at sites where a special chip area is to be avoided, said method comprising the steps of:

causing relative movement between the mask and the wafer for successive printing by moving along orthogonal axes from a position for exposure at one exposure site on the wafer to a position for exposure at a next exposure site on the wafer, except about sites on the wafer where the special chip area is to be avoided; and causing relative movement between the mask and the wafer for printing about at least a portion of the special chip area by moving obliquely with respect to said axes from a position for exposure at one exposure site on the wafer adjacent the special chip area to a position for exposure at another exposure site on the wafer adjacent the special chip area.

2. A divisional printing method according to claim 1 in which a plurality of special chip areas are on the wafer.

3. A divisional printing method according to claim 2, further comprising the step of printing m chips, in the direction defined between two of the adjacent special chip areas, at each exposure site on the paper in each exposure shot, with each chip having a width l and wherein the internal spacing between the two adjacent special chip areas is $L = (mN+q)l$ where N is a positive integer and q is a positive integer satisfying $0 \leq q \leq m-2$.

* * * * *